(12) United States Patent
Menon et al.

(10) Patent No.: US 8,904,253 B2
(45) Date of Patent: Dec. 2, 2014

(54) METHOD AND APPARATUS FOR TESTING I/O BOUNDARY SCAN CHAIN FOR SOC'S HAVING I/O'S POWERED OFF BY DEFAULT

(75) Inventors: Sankaran M. Menon, Austin, TX (US); Robert R. Roeder, Austin, TX (US); Liwei E. Ju, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 212 days.

(21) Appl. No.: 13/532,108

(22) Filed: Jun. 25, 2012

(65) Prior Publication Data

US 2013/0346816 A1 Dec. 26, 2013

(51) Int. Cl.
| | | |
|---|---|---|
| *G01R 31/28* | (2006.01) | |
| *G06F 11/00* | (2006.01) | |
| *G01R 31/3185* | (2006.01) | |
| *G01R 31/319* | (2006.01) | |
| *G01R 31/317* | (2006.01) | |
| *G06F 1/32* | (2006.01) | |

(52) U.S. Cl.
CPC *G01R 31/318575* (2013.01); *G01R 31/318572* (2013.01); *G01R 31/318533* (2013.01); *G01R 31/2815* (2013.01); *G01R 31/318508* (2013.01); *G01R 31/318597* (2013.01); *G01R 31/31905* (2013.01); *G01R 31/31713* (2013.01); *G01R 31/31717* (2013.01); *G06F 1/3278* (2013.01); *G06F 1/3206* (2013.01); *G06F 1/3246* (2013.01); *G06F 1/32* (2013.01); *G06F 1/3203* (2013.01); *G06F 1/3287* (2013.01)
USPC ............. 714/727; 714/726; 714/729; 714/43; 714/44; 714/56

(58) Field of Classification Search
CPC .............. G01R 31/318575; G01R 31/318572; G01R 31/2815; G01R 31/318508; G01R 31/318533; G01R 31/318597; G01R 31/31905; G01R 31/31713; G01R 31/31717; G06F 1/3278; G06F 1/3287; G06F 1/32; G06F 1/3203; G06F 1/3206; G06F 1/3246
USPC ................... 714/726, 727, 729, 43, 44, 56
See application file for complete search history.

(56) References Cited

U.S. PATENT DOCUMENTS

| | | | | |
|---|---|---|---|---|
| 6,754,863 | B1* | 6/2004 | Grannis, III | 714/729 |
| 6,760,876 | B1* | 7/2004 | Grannis, III | 714/729 |
| 6,766,486 | B2* | 7/2004 | Neeb | 714/724 |
| 6,813,739 | B1* | 11/2004 | Grannis, III | 714/729 |
| 7,000,163 | B1* | 2/2006 | Dirks et al. | 714/727 |
| 7,392,447 | B2* | 6/2008 | Tang et al. | 714/726 |
| 8,555,120 | B2* | 10/2013 | Ahn et al. | 714/724 |
| 8,555,123 | B2* | 10/2013 | Wu et al. | 714/727 |
| 2013/0024737 | A1* | 1/2013 | Marinissen et al. | 714/727 |
| 2013/0086441 | A1* | 4/2013 | Yang et al. | 714/727 |
| 2014/0047292 | A1* | 2/2014 | Swoboda | 714/726 |

\* cited by examiner

*Primary Examiner* — John J Tabone, Jr.
(74) *Attorney, Agent, or Firm* — Law Office of R. Alan Burnett, P.S

(57) ABSTRACT

Methods and apparatus for testing Input/Output (I/O) boundary scan chains for Systems on a Chip (SoCs) having I/Os that are powered off by default. Some methods and apparatus include implementation of boundary scan chain bypass routing schemes that selectively route a boundary scan chain path around I/O interfaces and/or ports that are powered off by default. Other techniques include selectively power-on I/Os that are powered off by default in a manner that is independent of SoC facilities for controlling the power state of the I/Os during SoC runtime operations. Various schemes facilitate boundary scan testing in accordance with IEEE Std.-1149.1 methodology.

30 Claims, 13 Drawing Sheets

US 8,904,253 B2

METHOD AND APPARATUS FOR TESTING I/O BOUNDARY SCAN CHAIN FOR SOC'S HAVING I/O'S POWERED OFF BY DEFAULT

TECHNICAL FIELD

The field of invention relates generally to testing computer components and systems and, more specifically but not exclusively relates to techniques for testing Input/Output (I/O) boundary scan chains for Systems on a Chip (SoC) having I/Os that are powered off by default.

BACKGROUND ART

In the 1980s, the Joint Test Action Group (JTAG) developed a specification for boundary-scan testing that was standardized in 1990 as the IEEE Std. 1149.1-1990. In 1993 a new revision to the IEEE Std. 1149.1 standard was introduced (titled 1149.1a) and it contained many clarifications, corrections, and enhancements. In 1994, a supplement containing a description of the Boundary-Scan Description Language (BSDL) was added to the standard. It was originally designed for testing printed circuit boards using boundary scan, but JTAG testing has expanded to integrated circuits (e.g., processors, controllers, etc.), embedded systems, and other components. Boundary-scan, as defined by the IEEE Std.-1149.1 standard, is an integrated method for testing interconnects on printed circuit boards (PCBs) that are implemented at the integrated circuit (IC) level.

Generally, JTAG testing is implemented via facilities that are built into the device being tested (commonly referred to as the Device under Test or DUT) and an external tester that connects to the DUT via a debug or test port and provides stimulus and control signals to the DUT to implement various tests such as boundary scan tests and receives test result signals and data output from the DUT. This test result data and signals can then be processed to verify the operation of the DUT. Typically, devices such as processors or Systems on a Chip (SoCs) have pins that are electronically connected to the JTAG tester via a debug port coupled to a socket the processor is mounted in. Similar debug ports may be provided at the board level, although there are instances where JTAG is used only for design debug and the production boards do not include a debug port and/or debug port connector or other type of JTAG interface.

Recently, there has been an increased emphasis on power reduction in computer devices and systems. Although applicable to both desktop computers and servers, reduction of power is particularly important for mobile platforms including laptop, notebooks, ultrabooks, tablets, mobile phones, etc. Under traditional processor and SoC designs, all input/output (I/O) interfaces and associated logic and ports (as applicable) are brought up to an operating state when the processor/SoC is initialized. Notably, each I/O interface/port consumes some base level of power whether or not it is in use. In consideration of this, recent SoC designs have provisions for disabling I/O interface and ports when not in use. Moreover, selected I/O interfaces and ports may not power up until they are needed, thus facilitating on-demand functionality. Under one approach, this functionality is facilitated through use of internal voltage regulators (referred to as Low Drop Out (LDO) circuits) that are turned on by a power management unit using firmware or other means. However, if firmware is required to turn on the I/Os to enable boundary scan testing, the scheme is not compliant with current IEEE Std. 1149.1 methods of enabling the boundary scan. In addition, since boundary scan of the I/Os requires a complete circuit path through each I/O's boundary scan cell, the boundary scan chain is broken when an I/O is not powered.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 5b' is a schematic diagram illustrating an augmentation to the bypass routing scheme of FIG. 5b under which the position of the bypass switches is a function of whether or not power is provided to the HDMI interface and port;

FIG. 5c' is a schematic diagram illustrating an augmentation to the bypass routing scheme of FIG. 5c under which the position of the bypass switches is a function of whether or not power is provided to the HDMI interface and port;

DESCRIPTION OF THE EMBODIMENTS

Embodiments of methods and apparatus for testing Input/Output (I/O) boundary scan chains for Systems on a Chip (SoC) having I/Os that are powered off by default are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

The embodiments of the invention disclosed herein enable boundary scan testing for SoCs and systems employing the SoCs under which the SoCs include one or more I/Os that are powered off by default. As described above, boundary scan testing methodologies that are used by the manufacturers of processor and computer devices and systems are defined in IEEE Std.-1149.1 standard. Accordingly, in order to better understand how the principles and teachings discussed herein may be implemented, the following discussion of a generic implementation of boundary scan testing under the IEEE Std.-1149.1 standard is provided.

Figure 1:
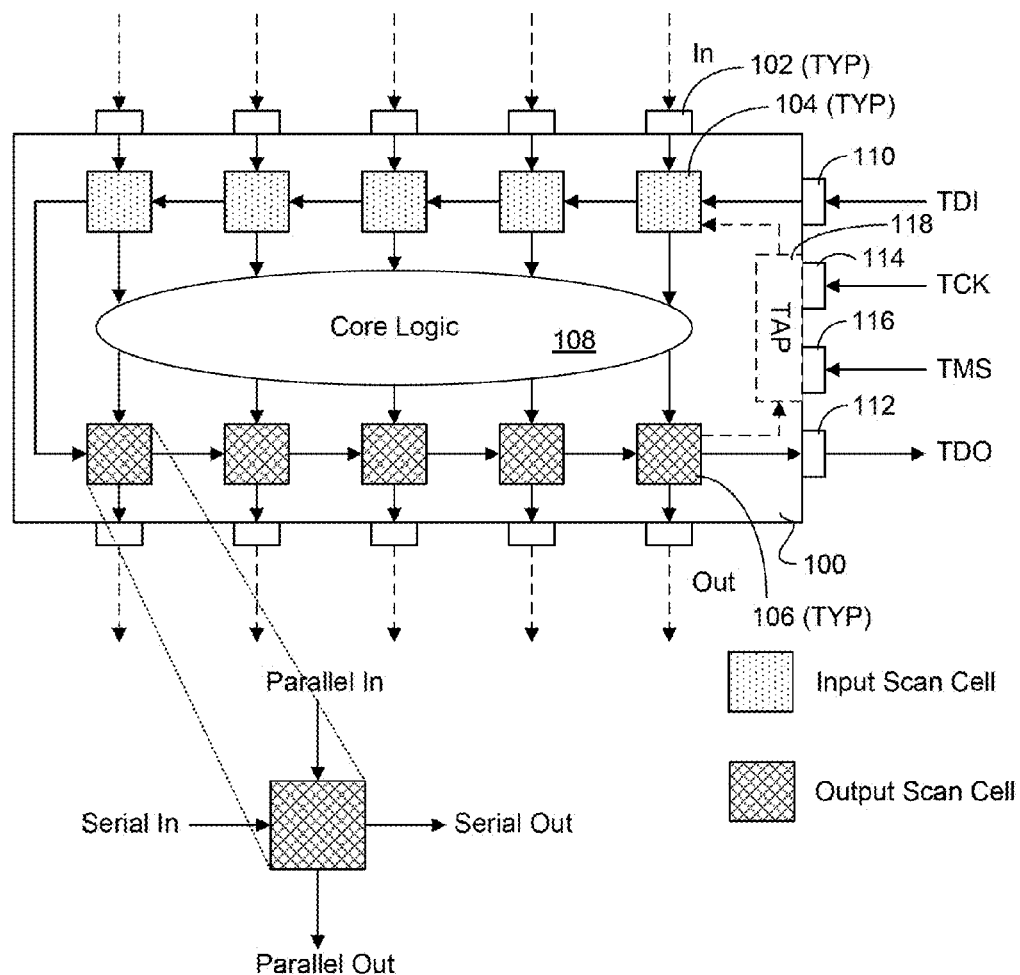
FIG. 1 depicts a generic representation of boundary scan architecture for an integrated circuit as defined by the IEEE Std.-1149.1 standard.

FIG. 1 depicts a generic representation of a boundary scan architecture for an integrated circuit (IC) 100 as defined by the IEEE Std.-1149.1 standard. Under a typical implementation, a boundary scan chain is formed by serially connecting multiple boundary scan cells disposed proximate to the periphery of the IC that are coupled to respective I/O pins 102. The boundary scan cells are classified as input scan cells 104 and output scan cells 106. Input scan cells correspond to cells coupled to a device's primary inputs, while output scan cells correspond to the device's primary outputs. Each boundary scan cell includes serial inputs and outputs, and parallel inputs and outputs, as illustrated in FIG. 1. The parallel inputs to input scan cells 104 and the parallel outputs of output scan cells 106 are coupled to respective I/O pins 102. Meanwhile, the parallel outputs of the input scan cells and the parallel input of the output scan cells are coupled to various IC circuitry comprising logic blocks that are collectively depicted as core logic 108. In general, a given parallel signal path depicted as including core logic 108 may include a path through a logic block associated with the I/O pins coupled at the ends of the path or may employ a bypass route between an input scan cell and an output scan cell.

The collection of boundary-scan cells is configured into a parallel-in, parallel-out shift register forming a boundary scan chain. A parallel load operation called a Capture operation causes signal values on device input pins to be loaded into input cells, and signal values passing from the internal logic to device output pins to be loaded into output cells. A parallel unload operation called an Update operation causes signal values already present in the output scan cells to be passed out through the device's output pins. Signal values already present in the input scan cells will be passed into the internal logic (e.g., as depicted by core logic 108).

Data can also be Shifted around the shift register, in serial mode, starting from a dedicated device input pin called a Test Data In (TDI) pin 110 and terminating at a dedicated device output pin called a Test Data Out (TDO) pin 112. The Test Clock, TCK, is fed in via another dedicated device input pin 114 and the various modes of operation are controlled by a dedicated Test Mode Select (TMS) serial control signal at TMS input pin 116. The TCK and TMS signals are received as inputs by Test Access Port (TAP) controller 118, which facilitates the boundary scan operation in response to the signals.

At the device level, the boundary-scan elements do not contribute to the functionality of the device's internal logic. Moreover, the boundary-scan path in this generic representation is independent of the function of the device. During run-time device operations, the boundary scan cells are configured in bypass mode such that applicable core logic blocks are (effectively) coupled directly to corresponding I/O pins.

Figures 2, 3:
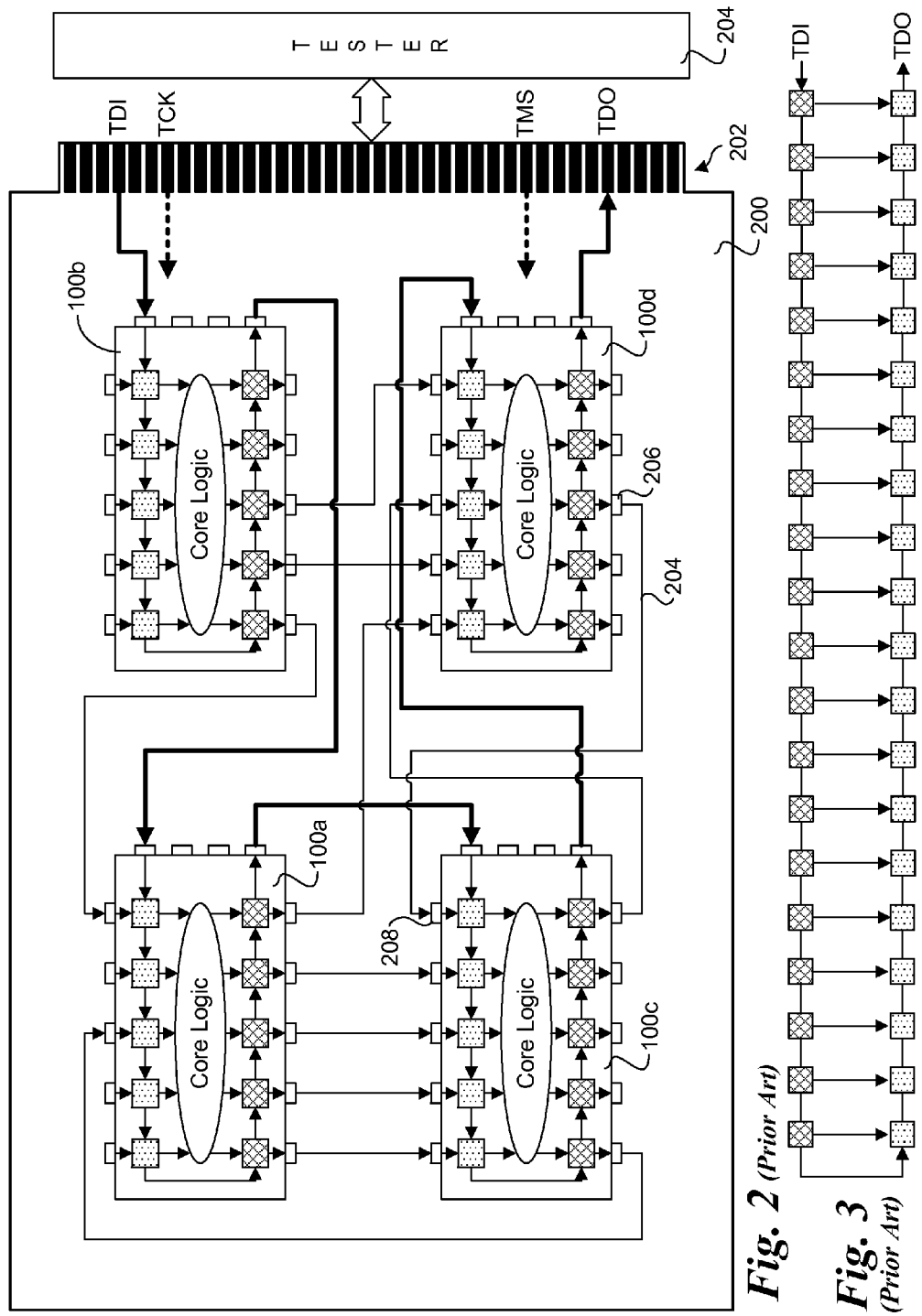
FIG. 2 is a generic depiction of an implementation of boundary scan testing at a board level.
FIG. 3 shows an abstracted view of the boundary scan cells and interconnects of the test configuration shown in FIG. 2.

A generic depiction of implementation of boundary scan testing at a board level is shown in FIG. 2. In the figure, four ICs 100a, 100b, 100c, and 100d are mounted on a PCB 200 including an edge connector 202. Input signals TDI, TCK and TMS are received from an external tester 204, which also receives TDO signals. The TDI and TDO signals for ICs 100a, 100b, 100c, and 100d are daisy-chained, creating a global scan path that is terminated at the TDO signal pin on edge connector 202. The TCK and TMS signals are connected as parallel inputs to the TCK and TMS input pins for each of ICs 100a, 100b, 100c, and 100d (wiring not shown). As an option to an edge connection, various other types of connectors used for facilitating coupling of signals between a PCB and a tester may be used.

Additional wiring depicted in FIG. 2 is illustrative of interconnect wiring on PCB 200 that is used to connect respective I/O pins on the ICs via a corresponding wired paths (e.g., copper or gold traces in the PCB). For example, a wired path 204 connects an I/O pin 206 on IC 100d to an I/O pin 208 on IC 100c.

During boundary scan testing, input signals comprising test stimuli are generated by tester 204 and received at the TDI, TCK, and TMS pins of edge connector 202. Depending on the particular stimuli, various tests can be applied across the IC interconnects via the global scan path by loading the stimuli values into applicable boundary scan cells using TDI shift-in operations, which applies stimulus across the interconnects (corresponding to an update operation), capturing the response at device input scan cells (capture operation) and shifting the response values out to the TDO pin on edge connector 202 (shift-out operation).

FIG. 3 shows an abstracted view of the boundary scan cells and interconnects of the test configuration shown in FIG. 2. As shown, there is one continuous boundary scan chain comprising a global path between the various boundary scan cells. Although depicted as respective interconnect connections between output and input boundary scan cells, this is merely illustrative, as there is no requirement that there be any output from or input to a given cell.

Each of the examples shown in FIGS. 1-3 correspond to a logical representation of the boundary scan cell and interconnect configurations. The actual arrangement of boundary scan cells will vary by device and corresponding I/O pin layout. Moreover, although logically depicted as being located proximate to the periphery of a device (corresponding to IC configurations having interconnect pins about their periphery), the location of boundary scan cells on actual devices will be dependent on the layout of the various logic blocks employed by the device in combination with the location of the I/O pins, which is a function of the device's packaging. For example, SoC are typically packaged using Pin Grid Arrays (PGAs) or Ball Grid Arrays (BGAs) under which the applicable interconnect members (either pins or solder balls) are configured in a 2 dimensional grid on the underside of the device.

Accordingly, some of the I/O pins may not be located on the outside of the grid for SoCs that employ a large number of I/O pins.

Figure 4:
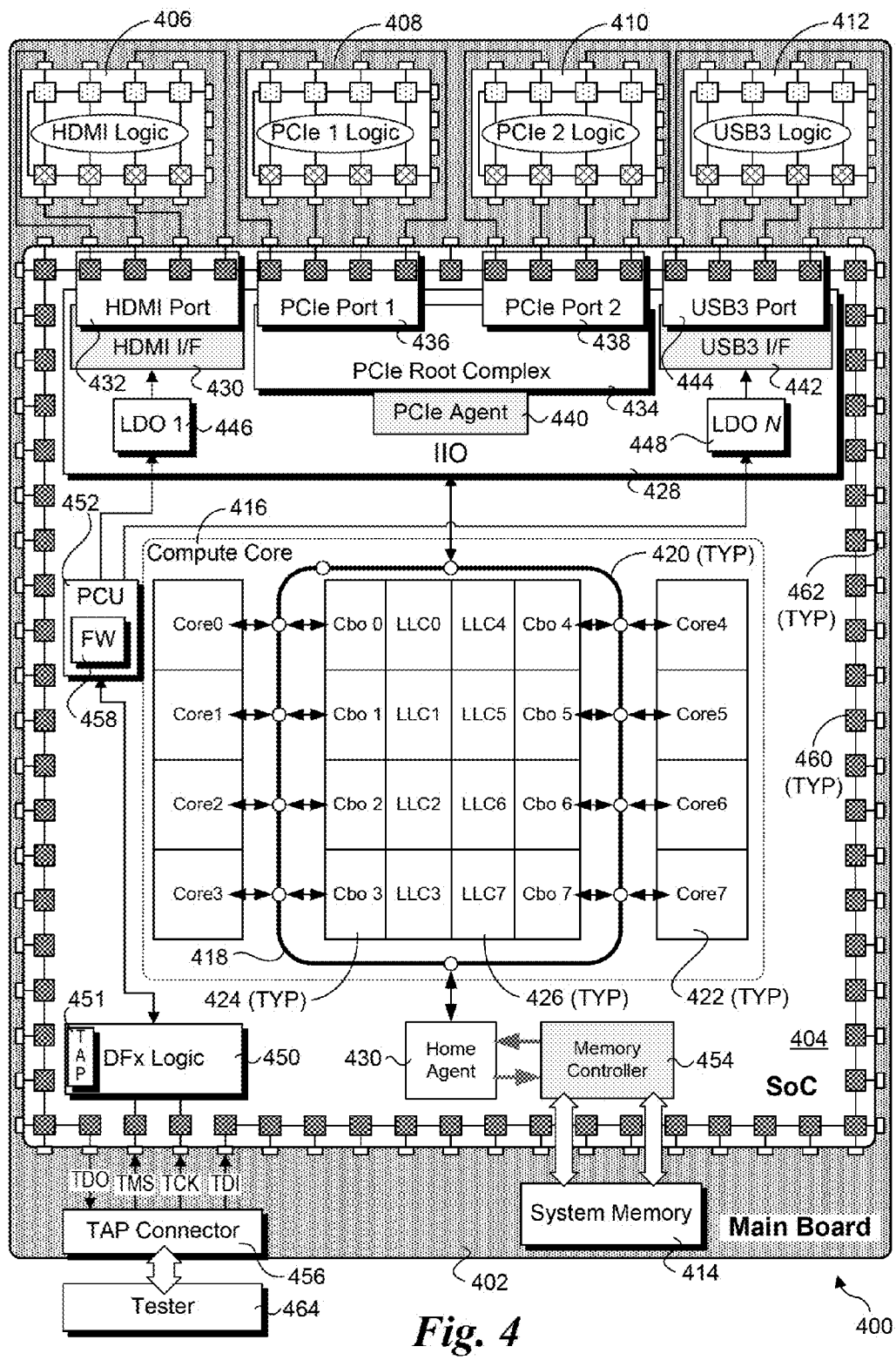
FIG. 4 is a schematic diagram illustrating an exemplary system for various aspects of an SoC that are implemented in embodiments of the invention depicted in FIGS. 4b-4e.

FIG. 4 shows a system 400 used herein for illustrating various aspects of the embodiments of the invention described below. System 400 is generally illustrative of a typical computing platform in which aspects of the embodiments may be implemented. The system includes a main board 402 having various components mounted thereon, including an SoC 404, an HDMI (High-Definition Multimedia Interface) device host 406, PCIe (Peripheral Component Interconnect Express) devices 408 and 410, a USB3 (Universal Serial Bus, third generation) device host 412, firmware 413 and system memory 414. In an actual implementation, additional components would be mounted to main board 402; however, these are not shown in order to not obscure the principles and teachings of the embodiments disclosed herein.

SoC 404 is illustrative of various processor (aka Central Processing Unit (CPU)) architectures implemented in modern computing platforms including mobile platforms such as laptops, notebooks, ultrabooks, tablets, mobile phones, etc., and fixed platforms such as personal computers, servers, workstations, etc. Towards the center of SoC 404 is a compute core 416. The term compute core, as used herein, represents the logic/functional units of an SoC typically used for core computing operations. These typically will include one or more processor cores, memory caches, and cache-related components.

The compute core shown in FIG. 4 is illustrative of a multi-core architecture employing a ring interconnect 418 including a plurality of nodes 420 to which various types of logic blocks are coupled. These include eight processor cores 422 (labeled Core0-Core7), which are coupled to respective caching boxes 424 (labeled Cbo 0-7, also referred to as CBOXes) and last level caches (LLCs) 426 (labeled LLC0-LLC7) via respective nodes 420. In one embodiment, each processor core is part of a compute engine including first and second level caches (i.e., L1/L2 caches). Also connected to respective ring nodes are an Integrated I/O module (IIO) 428 and a home agent 430. In addition to the components shown in FIG. 4, a typical processor architecture employing a ring interconnect would include addition nodes and components that are not shown for simplicity and clarity.

IIO module 428 comprises a set of components, agents, and interfaces for facilitating I/O operations to both on-board and external (to the system) devices. In the illustrated embodiment, these include an HDMI interface (I/F) 430 including an HDMI port 432, a PCIe root complex 434 including two PCIe ports 436 and 438 and associated with a PCIe agent 440, and USB3 interface 442 including a USB3 port 444. HDMI interface 430 and USB3 interface 442 are powered by respective internal voltage regulators referred to a Low Drop Out (LDO) circuits 446 and 448, which operate as controllable power sources. In addition to the components shown, an IIO module may typically include additional interfaces, agents, and ports.

Under typical nomenclature, a given I/O block (also referred to simply as an I/O) on an SoC may include one or more of an interface, port and agent. In some instances, the terms "interfaces" and "ports" may generally be referring to the same things, even though they may use different terms by convention. For example, an I/O interface on a device that has a connector often is referred to as an I/O port, while an interface between an I/O block on an SoC and an I/O host device in a platform including the SoC may be referred to as an interface or a port, depending on the type of device and historical usage. In order to avoid confusion, the terminology "interface/port" is used herein to refer to an interface and/or port corresponding to an associated I/O on an SoC. Accordingly, the usage of the terminology "interface/port" is not to be limited to a combination of an interface and a port, but rather may include this combination, may correspond to just an interface, or may correspond to just a port.

Additional components for SoC 404 depicted in FIG. 4 include a DFx logic block 450, a Power Control Unit (PCU) 452, and a memory controller 454. DFx (Design for Testing) logic 450 is operatively coupled to a TAP connector 456 on main board 402 and includes logic for facilitating boundary scan operations in accordance with the embodiments described herein, including a TAP controller 451. PCU 452 is used to control power levels and operational states of various system components, including LDO circuit 446 and LDO circuit 448. This is facilitated, in part, via firmware (FW) 458.

To support boundary scan operations, SoC 404 includes a boundary scan chain and applicable input and output boundary scan cells. For simplicity and convenience, this is depicted in FIG. 4 by means of a boundary scan chain including a plurality of boundary scan cells 460 disposed proximate to the periphery of the SoC, with each boundary scan cell coupled to a respective I/O pin 462. In general, a given boundary scan cell 460 may comprise an input or an output boundary scan cell; accordingly, boundary scan cells 460 are depicted having a different crosshatch pattern than the input and output boundary cells 104 and 106 of FIGS. 1-3. Also, FIG. 4 only shows selected interconnects between a portion of boundary scan cells 460 and corresponding boundary cell scans in HDMI device host 406, PCIe devices 408 and 410, and USB3 device host 412.

TAP connector 456 is configured to interface with a tester 464 that is employed for boundary scan test operations. When tester is coupled to main board 402 via TAP connector 456 the tester is able to provide TCK and TMS input signals to DFx logic block 450, to provide a TDI input signal to an input end of the SoC boundary scan chain, and to receive a TDO output signal from an output end of the SoC boundary scan chain. In addition, main board 402 includes wiring to support global routing of a boundary scan chain and for providing TCK and TMS inputs to each of HDMI device host 406, PCIe devices 408 and 410, and device host 412 (global routing wiring not shown in FIG. 4, but shown in FIGS. 4b-4e).

In general, the components of SoC 404 are interconnected via various types of interconnects, which are depicted as lines, and single-headed and double-headed arrows in the figures herein for convenience. As discussed above, in one embodiment, compute core 416 employs a ring interconnect 418. Optionally, the processor cores and related components and agents may be connected via an interconnect fabric (e.g., a 2D mesh interconnect). The interconnects may comprise point-to-point interconnects (e.g., QPI, PCIe, IOSF, Open Core Protocol (OCP) etc.), as well as buses and other types of interconnect structures.

As illustrated in FIG. 4, a portion of the boundary scan chain on SoC 400 passes through each of HDMI port 432, PCIe ports 436 and 438, and USB3 port 444. This depiction is used to illustrate that each of these ports has to be in an operational state in order for the cells in the boundary scan chain to be connected. However, this creates a problem for power-saving SoC designs that support on-demand I/O port usage, since some I/O ports and host interfaces may be configured to be powered-off by default. For example, upon initialization of SoC 404 one or more I/O interface/ports may be configured to be powered off. The result of this is that the boundary scan chain is broken, and thus boundary scan testing cannot be performed.

Figure 4A:
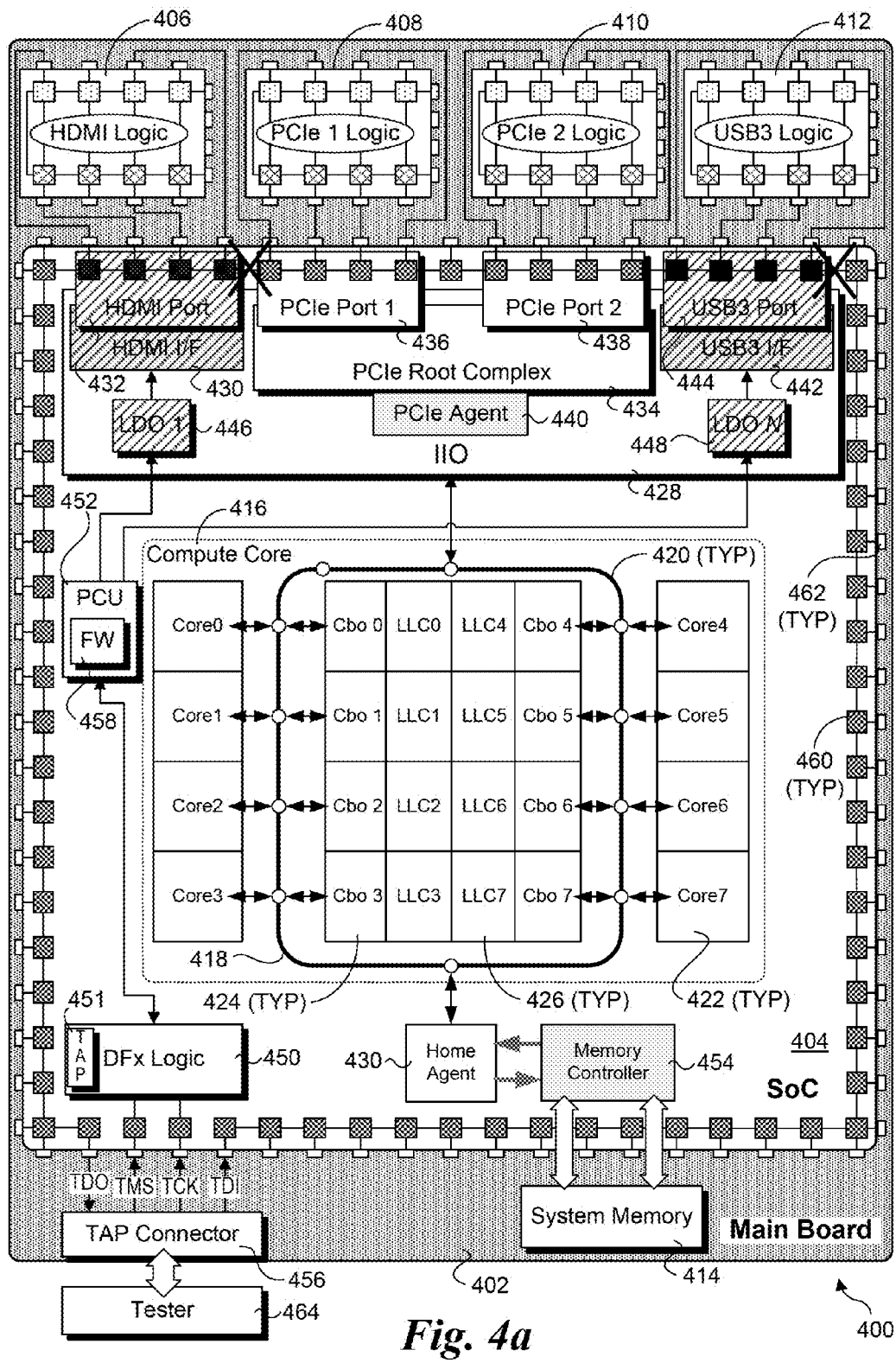
FIG. 4a is a schematic diagram illustrating a boundary scan chain breakage when the boundary scan chain passes through two I/O interface/ports that are not powered.

An example of a broken boundary scan chain is illustrated in FIG. 4a. In this example, the default power state for each of HDMI port 432 and USB3 port 444 is a powered-off state. Accordingly, when SoC 404 is initialized, logic in firmware 458 causes PCU 452 to configure LDO circuits 446 and 448 such that they do not provide power to HDMI interface 430 and USB3 interface 442, resulting in HDMI port 432 and USB3 port 444 being inoperative. This is depicted using an angled crosshatch pattern for each of LDO circuits 446 and 448, HDMI interface 430 and USB3 interface 442, and HDMI port 432 and USB3 port 444, indicating they are not powered and inoperative. In addition, the boundary scan cells in each of HDMI port 432 and USB3 port 444 are shaded in black, indicating they are inoperative.

This results in two breaks in the boundary scan chain, as indicated by the large X's in FIG. 4a. This prevents the serial signal path associated with the TDI input and TDI output signals from traversing the portions of the boundary scan chain passing through HDMI port 432 and USB3 port 444. As a result, it is not possible to perform boundary scan testing for system 400.

As described above, HDMI port 432 and USB3 port 444 are on-demand ports, which are configured to be turned off by default. In one embodiment, SoC 404 includes logic and interconnect wiring to sense when an HDMI cable connector is inserted into HDMI port 432 and/or when a USB3 cable connector is inserted into USB3 port 444, with both of these events indicating a user desires to use the corresponding device interface/ports to facilitate usage of an device coupled at the other end of the cable. For example, a video player or display that employs an HDMI cable or a device that may be connected via a USB3 cable. Optionally, the power state of HDMI port 432 or USB3 port 444 may be selected in response to a detected user input via a device user interface, such as a user selecting to view a high-definition video on a smartphone, which result in the activation of HDMI interface 430 and HDMI port 432.

Typically, turning on an on-demand port and associated interface may be effected by logic in PCU 452, such as provided by firmware 458, or via other means. In response to an applicable on-demand event, PCU will send a signal or otherwise facilitate delivery of a signal to an applicable LDO circuit to cause the LDO circuit to provide power to the interface and port associated with the on-demand event. Accordingly, in one embodiment PCU firmware is used to effect activation of one or more I/O interfaces and ports.

One requirement for IEEE Std.-1149.1 standard is that the boundary scan should be functional even without the core coming out of reset. However, if firmware is required to turn on an I/O interface/port to enable boundary scan testing, then this breaks the IEEE Std.-1149.1 methodology of enabling the boundary scan before the part comes out of reset.

In accordance with some embodiments, the foregoing problem is addressed by using a boundary scan chain bypass routing scheme employing a duplicative or "shadow" copy of the bypassed boundary scan cells. From the perspective of the tester, the SoC boundary scan chain appears to provide an identical configuration whether the boundary scan chain is routed via the bypass or routed normally. By placing the boundary scan routing in bypass mode, boundary scan testing in accordance with IEEE Std.-1149.1 methodology can be performed for the rest of the chain without requiring the SoC to come out of reset.

Figure 4B:
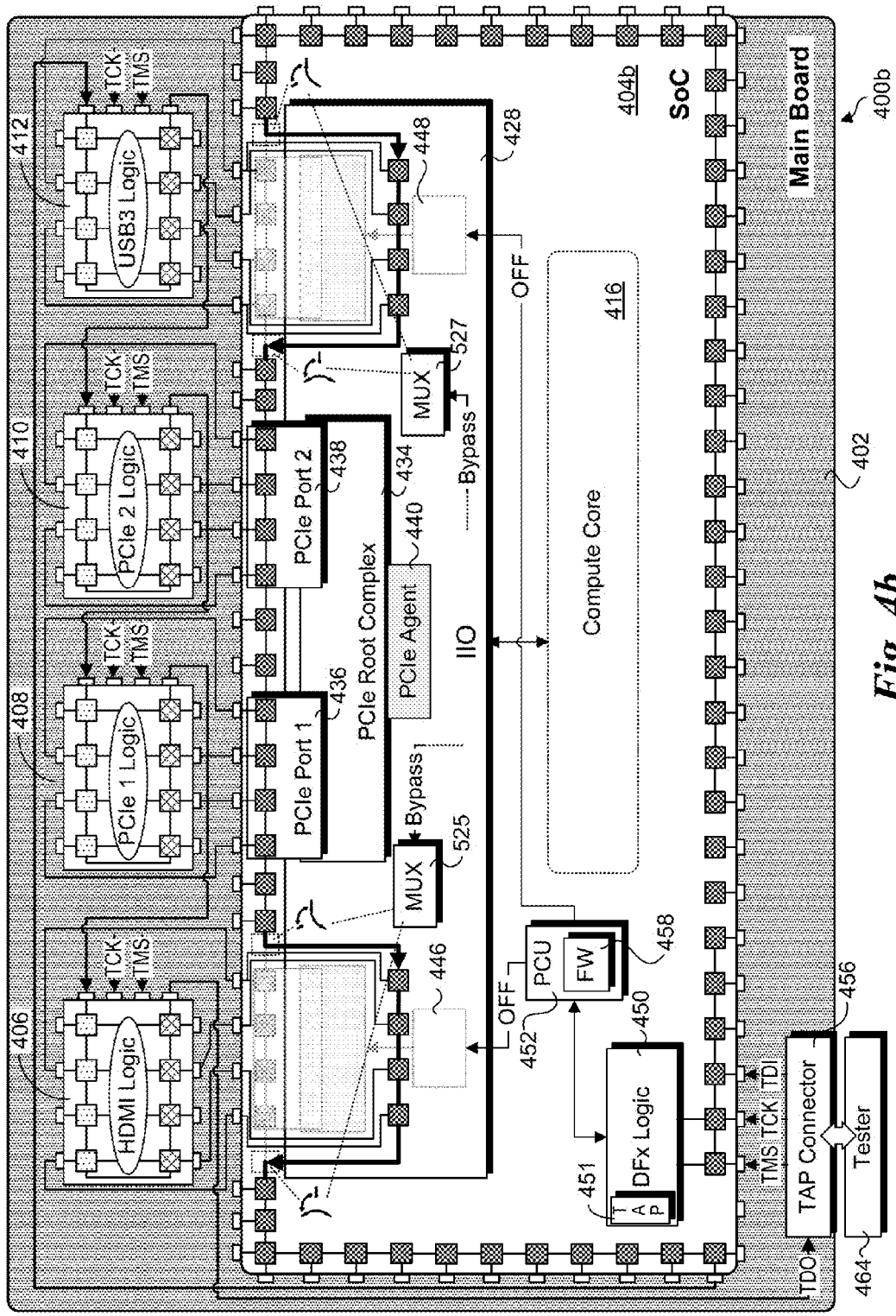
FIG. 4b is a schematic diagram illustrating an example of an implementation employing a boundary scan bypass scheme under which portions of the boundary scan chain are configured to be routed along routes that bypass un-powered I/O interface/ports.

An exemplary implementation of this scheme having a system configuration analogous to that of system 400 is shown in FIGS. 4b, 4c, 5a, and 5b. As shown in FIG. 4b, a system 400b includes an SoC 404b having a configuration similar to SoC 404 of FIG. 4, wherein components with shared reference numbers perform similar operations. For simplicity, compute core 416 is depicted as a single block with a dotted outline to indicate the compute core of SoC 404b is similar to computer core 416 of SoC 404. System 400b further shows additional details concerning routing of the global boundary scan chain for the system, which is merely exemplary and used for illustrative purposes. Moreover, the various depictions of the boundary scan cell configurations are generalized for simplicity; one having ordinary skill in the art will recognize that each device will have an associated set of boundary scan cells and I/O pins corresponding to that device.

In addition to the similarities between SoC 404b and SoC 404, SoC 404b further includes provisions for supporting bypass boundary scan chain routing around the HDMI interface and port and the USB3 interface and port when these components are powered down. In order to bypass the boundary scan chains passing through a given unpowered port, the portion of the boundary scan chain path passing through the port is rerouted using an applicable set of switches and shadow boundary scan cells that are coupled to the same SoC pins as their respective original (boundary scan chain path) cells.

Figure 5A:
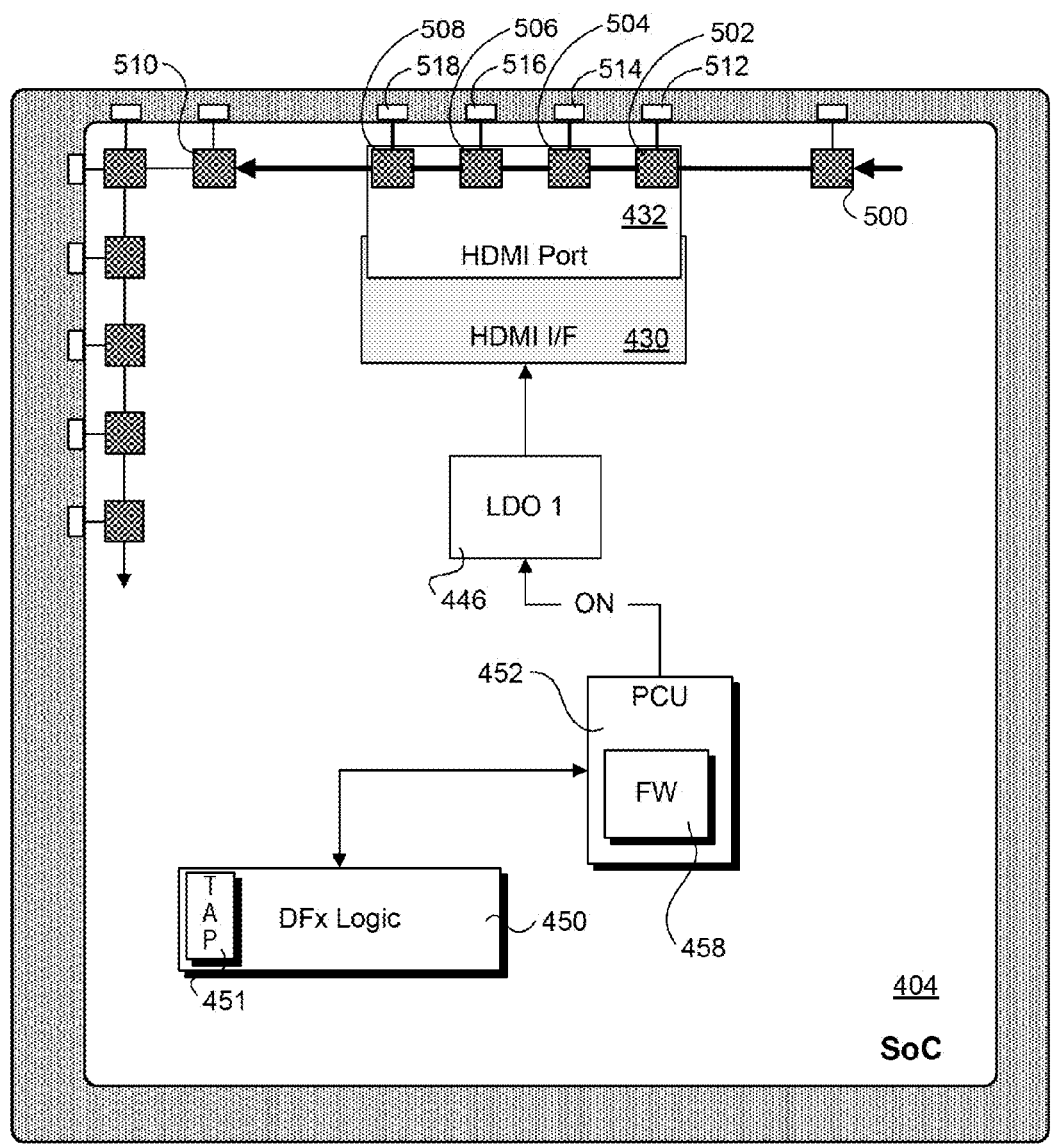
FIG. 5a is a schematic diagram illustrating a normal boundary scan chain path passing through an HDMI port.

For the purpose of comparison, a conventional boundary scan chain configuration through an operative (i.e., powered) HDMI port 432 is shown in FIG. 5a. The sequential propagation of the serial signals pertaining to the portion of the boundary scan cell chain shown in FIG. 5a proceeds from a boundary scan cell 500 to boundary scan cells 502, 504, 506, and 508 in HDMI port 432, and then to a boundary scan cell 510, with the propagation continuing along the rest of the chain in a counter-clockwise direction. As further detailed, boundary scan cells 502, 504, 506, and 508 are coupled to respective I/O pins 512, 514, 516, and 518 on SoC 404.

Figure 4C:
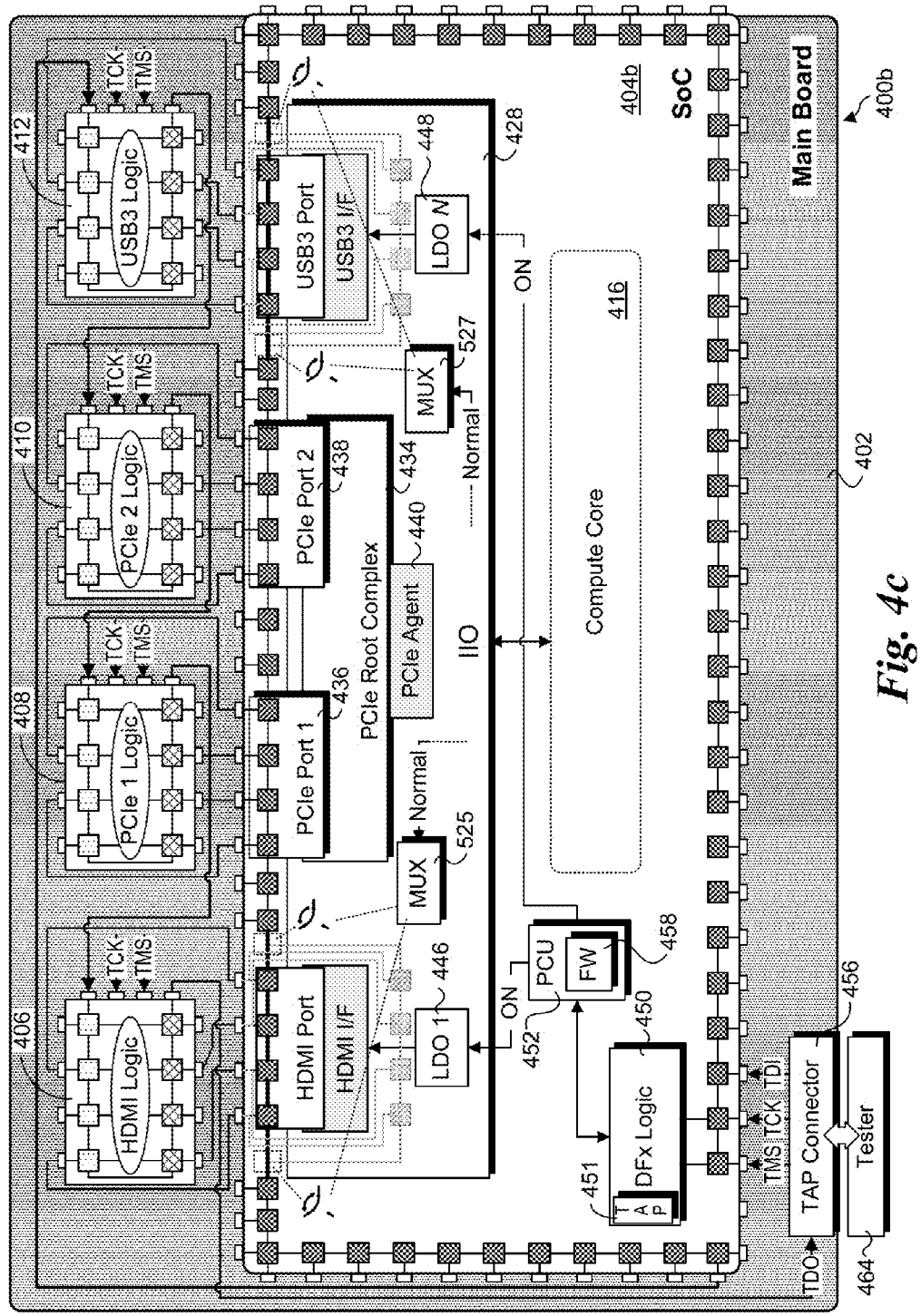
FIG. 4c is a schematic diagram of the system of FIG. 4b when the boundary scan chain routing is configured in a normal route mode passing through I/O interface/ports that are powered.
Figure 5B:
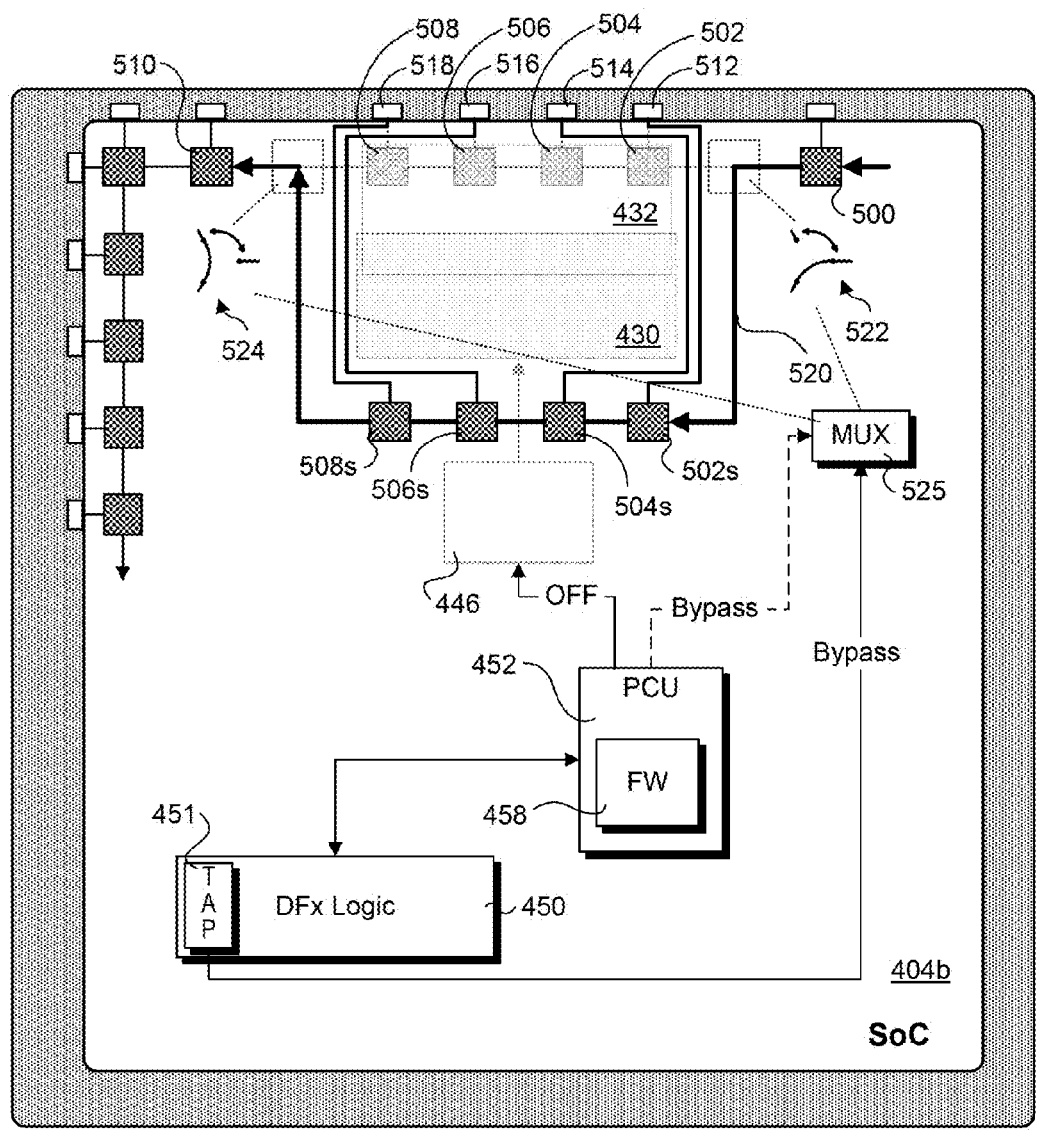
FIG. 5b is a schematic diagram illustrating further details of the bypass routing scheme of FIG. 4b as applied to an HDMI interface and port.
Figure 5B:
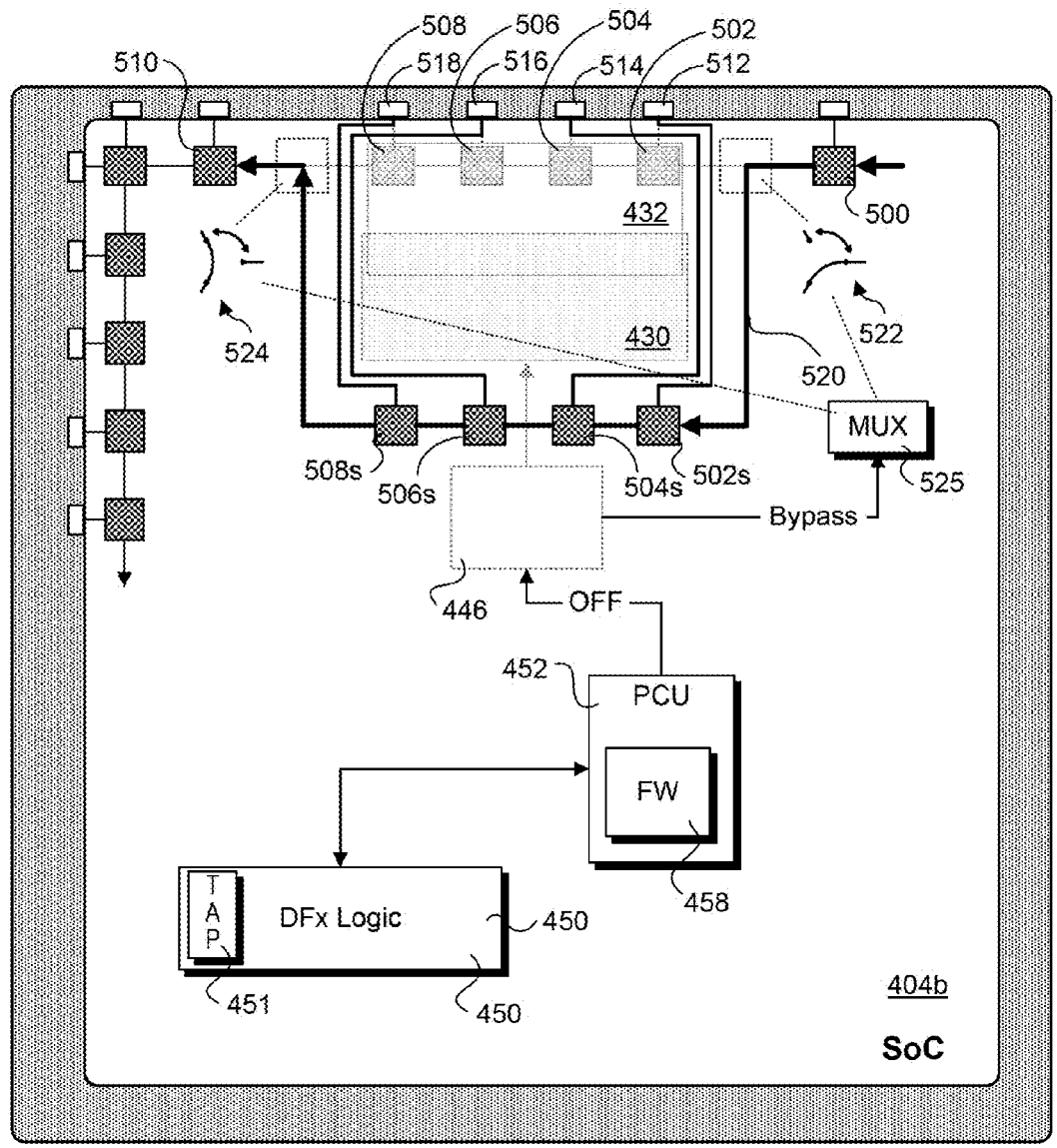

Detailed views of one embodiment of a switchable boundary scan chain bypass routing scheme implemented for the same HDMI interface and port are shown are FIGS. 5b 5b', 5c, and 5c', with similar operations for effecting bypass routing for both the HDMI interface/port and the USB3 interface/port shown in FIGS. 4b and 4c. As shown in FIG. 5b, a bypass boundary scan chain routing path 520 has been added, along with a pair of bypass switches 522 and 524 associated with a multiplexer (mux) 525. Generally, mux 525 may be located in the HDMI port or proximate to it. Bypass boundary scan chain routing path 520 passes through four shadow boundary scan cells 502s, 504s, 506s, and 508s. Each of these boundary scan cells comprises a shadow cell of a corresponding boundary scan cell along the original (non-bypassed) route shown in FIG. 5a, wherein the original and shadow cells share the same base reference number and the shadows cells having an appended 's.' In addition, wiring is added to create a wired path between each shadow cell and the pin associated with the shadow cell's associated original cell. For example, a wired path is added between shadow cell 502s and pin 512. Similarly, wired paths are added between shadow cell 504s and pin 514, shadow cell 506s and pin 516, and between shadow cell 508s and pin 518. In one embodiment, mux 525 is used for both switching the routing path and selecting the set of original cells or the set of shadow cells that are connected to I/O pins As further detailed, boundary scan cells 502, 504, 506, and 508 are coupled to respective I/O pins 512, 514, 516, and 518.

Under one embodiment, the bypass routing scheme operates as follows. During boundary scan testing while HDMI interface 430 and HDMI port 432 are not powered, logic in DFx logic block 450 (e.g., logic in TAP controller 451) provides an input to mux 525 to cause switches 522 and 524 to switch to a bypass position, thus causing the boundary scan chain signals to be routed around HDMI interface 430 and HDMI port 432 via bypass boundary scan chain routing path 520 rather than passing through HDMI port 432. This results in a completed boundary scan chain, even though HDMI port 432 is not powered. In addition, since shadow boundary scan cells 502s, 504s, 506s, and 508s are coupled to respective pins 512, 514, 516, and 518 when bypass routing is effected, the bypassed portion of the boundary scan chain appears to external (to SoC 404b) circuitry to be identical to the original non-bypassed route (such as shown in FIG. 5a).

Figure 5C:
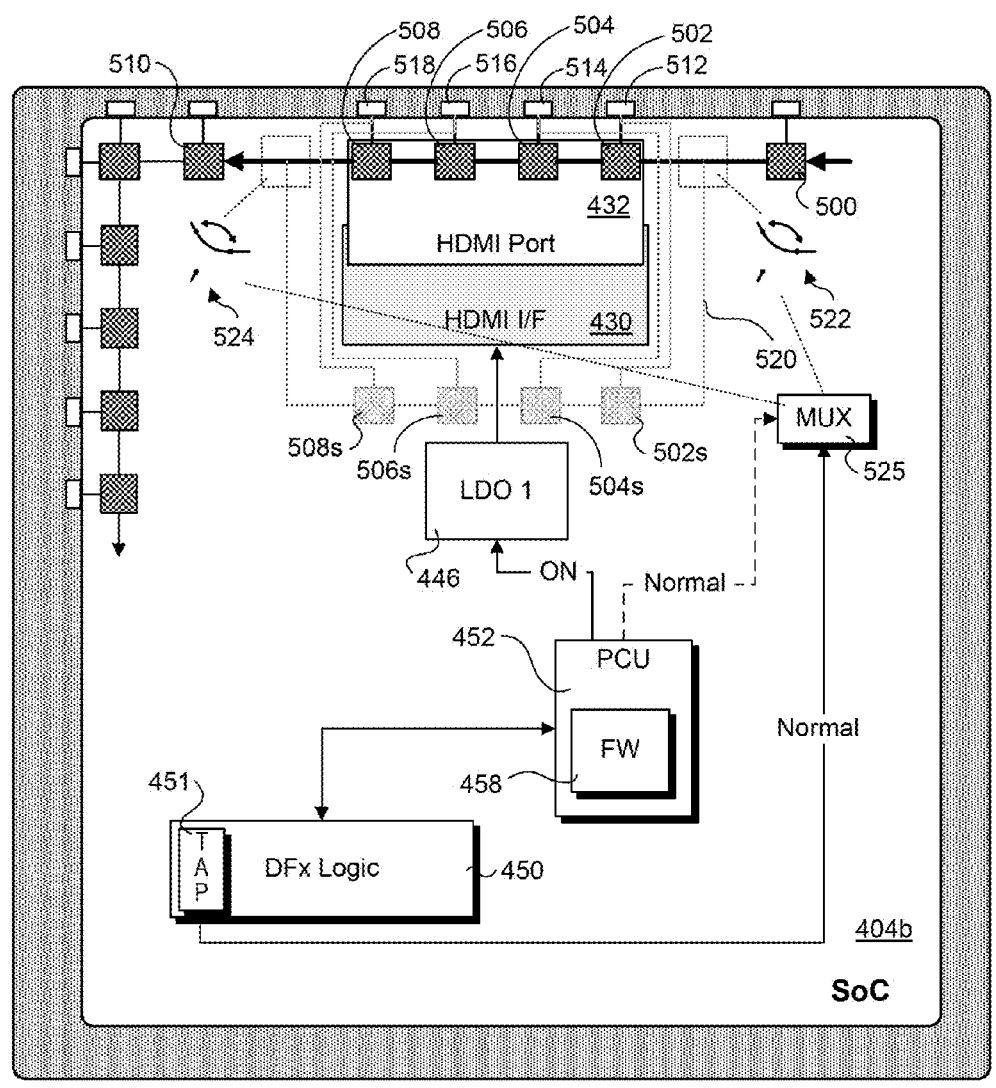
FIG. 5c is a schematic diagram illustrating the bypass routing scheme of FIG. 5b as applied to the HDMI interface and port when they are powered on and the bypass routing switches are configured to route the boundary scan chain along its normal route.
Figure 5C:
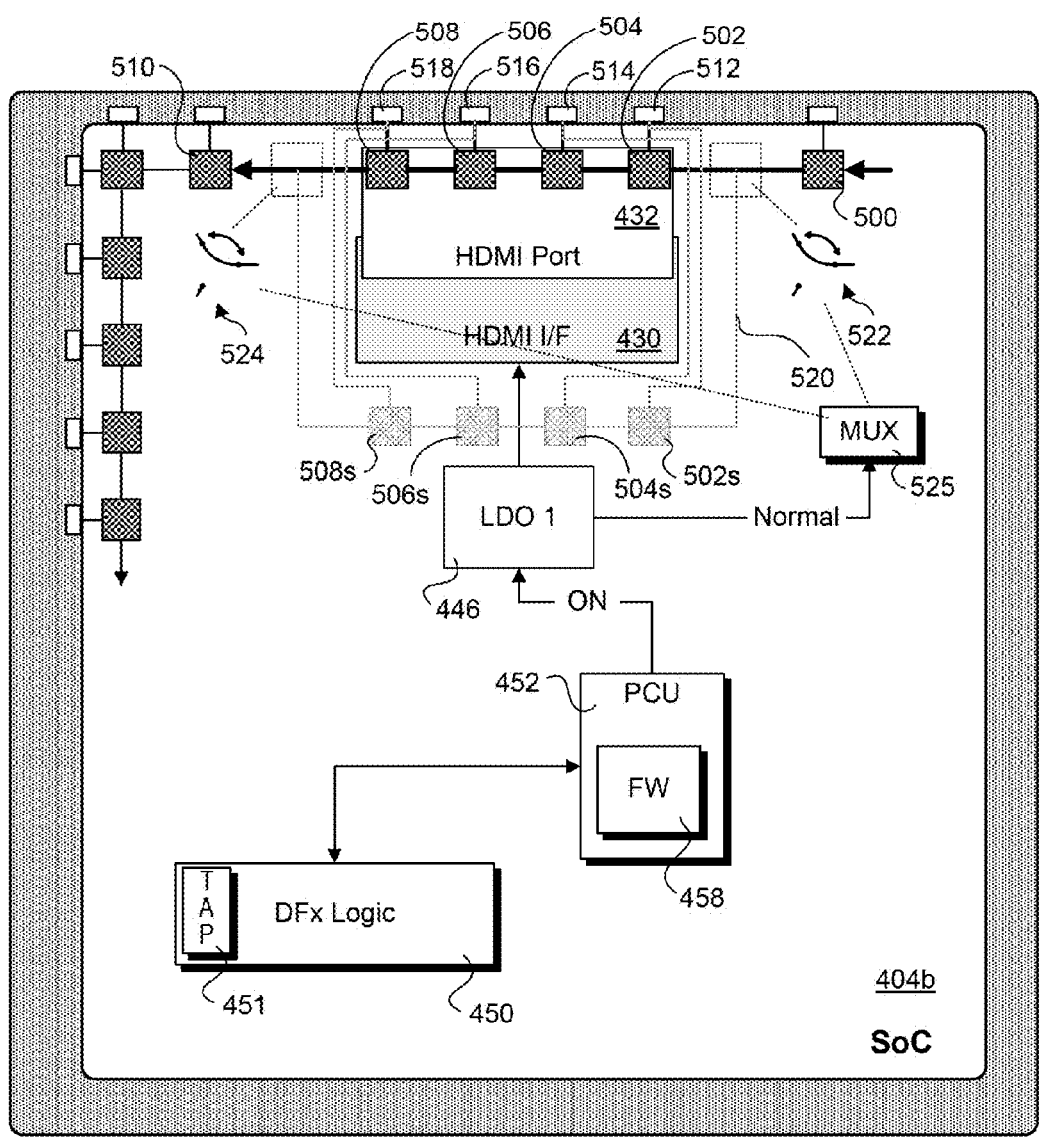

During normal SoC operations such as runtime operations after the SoC has been initialized, there may be I/O interface/port on-demand events that will cause the power state of a given I/O interface and/or port to change. For example, as described above, both of the HDMI interface/port and USB3 interface/port are turned off by default, but may be enabled (and thus powered up) on demand, such as in response to a user selection or detection of a connector inserted into an associated mating connector coupled to the main board. In one embodiment, it is desired to (effectively) disable use of a bypass boundary scan chain routing path when an associated interface/port is powered up. Accordingly, this may be accomplished by switching bypass switches to a "normal" position, such as depicted in FIG. 5c. As before, a signal for controlling the position of the bypass switches is generated by logic in DFx logic block 450 and provided as an input to mux 525, as depicted by the signal labeled "Normal" in FIG. 5c. This will cause switches 522 and 524 to be switched to a normal (i.e., non-bypass) position. The result is that the boundary scan chain is routed along the original non-bypassed path through boundary cells 500, 502, 504, 506, 508, and 510. The power state of shadow boundary scan cells 502s, 504s, 506s, and 508s may be turned off in connection with routing along the original path, or they remain powered since they collectively consume virtually no power. However, it is preferable to disconnect the shadow boundary scan cells 502s, 504s, 506s, and 508s from I/O pins 512, 514, 516, and 518 when the original routing is used, which may be effected via mux 525 in one embodiment.

In addition to employing logic in DFx logic block 450, bypass routing may be controlled using applicable signals generated through other means. In one embodiment, PCU 452 is used for this purpose, with applicable control logic being implemented via firmware 458 or other system firmware either included as part of the SoC or stored in a firmware storage device such as Flash memory that is mounted on the main board and external to the SoC (both not shown). Examples of embodiments employing PCU 452 and firmware 458 are illustrated in FIGS. 5b and 5c, wherein the dash lines emanating from PCU 452 are indicative of an optional bypass switch signal generation source.

In another embodiment, the bypass switches are controlled via signals corresponding to the power state of an LDO circuit, such as LDO circuit 446 shown in FIGS. 5b' and 5c'. Under this configuration, if LDO circuit 446 receives an 'ON' signal from PCU 452 and in response is configured to provide power to HDMI interface 430 and HDMI port 432, mux 525 receives a signal causing it to switch bypass switches 522 and 524 to their normal position. This results in a configuration similar to that shown in FIG. 5c'. Conversely, if LDO circuit 446 receives an 'OFF' signal from PCU 452, as shown in FIG. 5b', mux 525 receives a bypass control signal, causing bypass switches 522 and 524 to switch to a bypass routing position. The bypass switch signal may originate from an LDO circuit, or could be effected via passive logic tied to an LDO circuit power output wire. For example, the default position for the bypass switches could be set to the bypass position such that if no power is being provided by an LDO circuit to an I/O interface/port than the bypass switches would remain in their bypass positions. Once power is provided, a high-logic value (i.e., a logic '1') would appear at the control input of mux 525, causing bypass switches 522 and 524 to switch to their normal positions.

FIGS. 4b and 4b illustrate implementations of boundary scan cell bypass routing schemes applied to both the HDMI port/interface and the USB3 port/interface. Applicable provisions for facilitating a boundary scan cell bypass routing scheme similar to that described above for the HDMI interface/port are implemented for the USB3 port/interface, including a mux 527 for controlling associated bypass switches, as illustrated. During operation, mux 527 may receive a Bypass (FIG. 4b) or Normal (FIG. 4c) routing input from an applicable control entity or via signal sensing, such as from DFx logic 450 or PCU 452, or by sensing the power output state of LDO 448. In addition to bypassing both the HDMI port/interface and the USB3 port/interface, each I/O port/interface may be bypassed individually. More generally, bypass routing may be selectively applied to one or more I/O port/interfaces in a similar manner, including various types of I/Os not depicted in the figures herein.

Figure 4D:
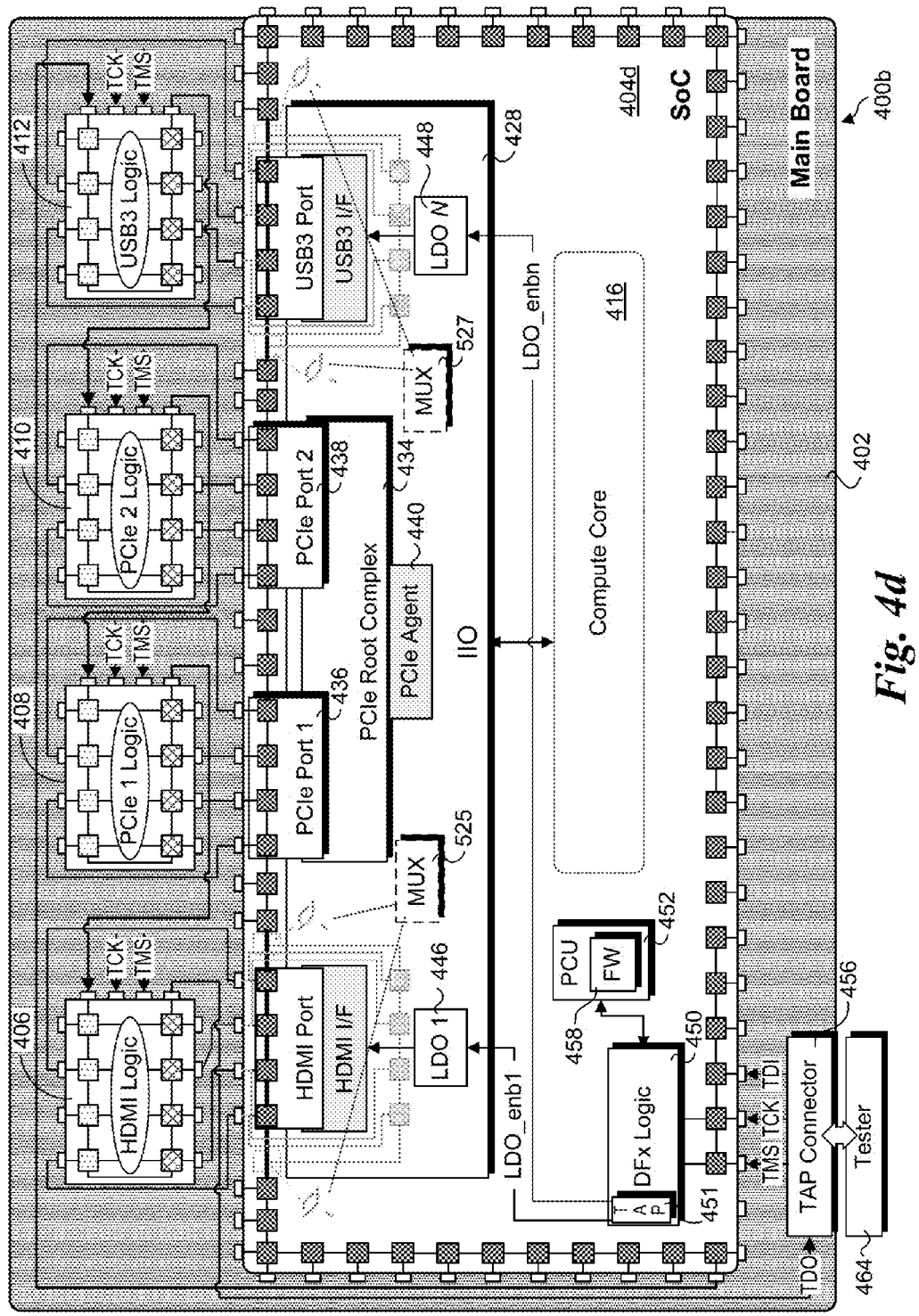
FIG. 4d is a schematic diagram illustrating an alternative scheme for controlling the bypass routing switches using signals generated by a TAP controller.

FIG. 4d illustrates an alternative scheme for facilitating boundary scan testing for SoCs employing I/O interface/ports that are powered off by default. Under this scheme, TAP controller 451 of an SoC 404d generates TAP control signals for switching the LDOs on and off in a manner that is independent of PCU 458. As illustrated, TAP controller 451 outputs an LDO_enb1 signal and an LDO_enbn signal, which are respectively received at LDO circuits 446 and LDO 448 and used to enable these LDO circuits to provide power to their associated I/Os. In response to receiving the LDO_enb1 and LDO enbn signals, LDO circuits 446 and 448 are switched on so as to provide power inputs to the HDMI interface/port and the USB3 interface/port. As a result of being powered on, the portions of the boundary scan chain through the HDMI and USB3 ports are not broken, and boundary scan operations can be performed as if these ports were powered on by default. This scheme may also be employed prior to SoC 404d coming out of reset, thus meeting the requirements of IEEE Std.-1149.1.

Depending on the particular implementation and boundary scan test considerations, embodiments in accordance with the configuration illustrated in FIG. 4d may or may not employ boundary scan chain bypass routing. This is depicted in FIG. 4d by showing muxes 525 and 527 in dashed outline (indicating they are optional), and graying out the bypass switches associated with the muxes.

Figure 4E:
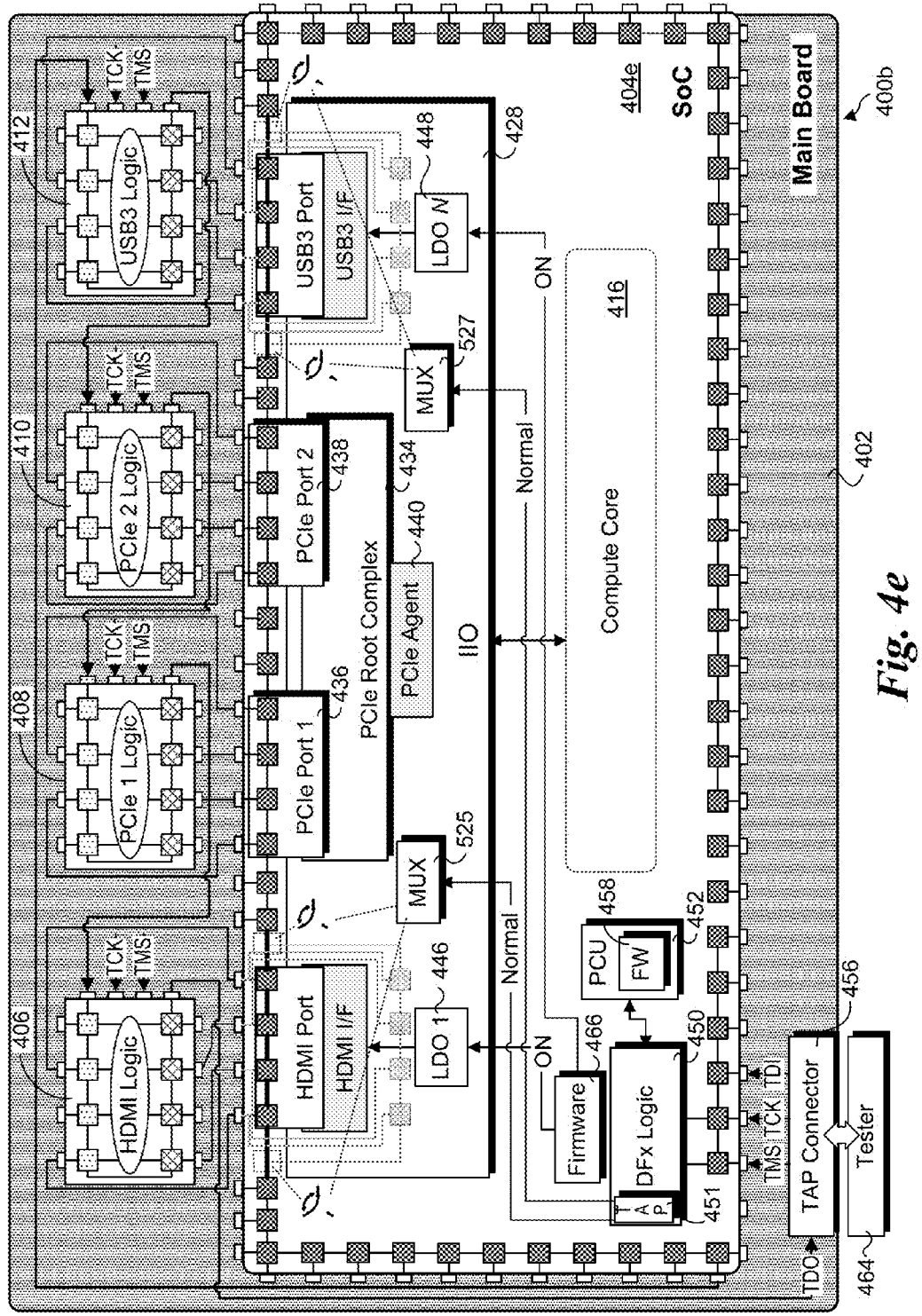
FIG. 4e is a schematic diagram illustrating a scheme for facilitating boundary scan testing of a system prior to an SoC coming out of reset employing control signals generated by firmware and a TAP controller, according to one embodiment.

Another alternative scheme is illustrated in FIG. 4e. Under this scheme the I/O interface/ports are allowed to turn on using the normal power up sequence and logic in firmware (e.g., as depicted by firmware 466) is implemented that turns on both the HDMI and the USB3 LDO circuits 446 and 448 via applicable control signals. Once the LDO circuits power-up the HDMI and the USB3 interface/ports, a TAP command is used to switch mux 525 and 527 to select the normal I/O port boundary scan path as opposed to the bypass path to test the boundary scan associated with the I/Os.

Each of the foregoing embodiments enables boundary scan testing of SoCs having one or more I/O interface/ports that are powered off by default. Moreover, under several of the embodiments, boundary scan testing may be performed in accordance with the IEEE Std.-1149.1 methodology of enabling the boundary scan before the SoC comes out of reset. In other embodiments, the techniques are in accordance with proposed additions to the IEEE Std.-1149.1 to support boundary scan testing of low-power SoCs with on-demand I/O interface/ports.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A System on a Chip (SoC), comprising:
a plurality of Input/Output (I/O) pins;
a plurality of I/O interface/ports, each I/O interface/port operatively coupleable to a respective set of I/O pins from among the plurality of I/O pins, wherein a first portion of the plurality of I/O interface/ports is powered on by default and a second portion of the plurality of I/O interface/ports is not powered on by default;
a boundary scan chain, comprising a plurality of boundary scan cells, wherein at least one portion of the boundary scan chain passes through the plurality of I/O interface/ports; and
circuitry and logic configured to facilitate boundary scan testing of a system including a main board on which the SoC is configured to be installed, the main board having a plurality of integrated circuits (ICs) installed thereon and interconnect wiring connecting selected I/O pins of the ICs to selected I/O pins of the plurality of I/O pins on the SoC when the SoC is installed, wherein the boundary scan testing is performed when the second portion of the plurality I/O interface/ports is not powered.

2. The SoC of claim 1, wherein the circuitry and logic configured to facilitate boundary scan testing facilitates boundary scan testing in accordance with the IEEE Std.-1149.1 standard.

3. The SoC of claim 1, wherein the circuitry and logic configured to facilitate boundary scan testing comprises at least one boundary scan chain portion comprising a switchable bypass route that is switchable to bypass a portion of the boundary scan chain passing through a first I/O interface/port of the second portion that is not powered on by default.

4. The SoC of claim 3, wherein an original portion of the boundary scan chain passing through the first I/O interface/port of the second portion includes a first plurality of boundary scan cells comprising original cells, and a bypass boundary scan chain portion comprises a second plurality of boundary scan cells including a shadow cell for each original cell in the first plurality of boundary scan cells.

5. The SoC of claim 3, wherein the circuitry and logic is further configured to selectively route the boundary scan chain along an original route through the first I/O interface/port of the second portion or along a bypass route that bypasses the first I/O interface/port of the second portion.

6. The SoC of claim 5, wherein the circuitry and logic includes a Test Access Port (TAP) controller configured to generate signals to selectively route the boundary scan chain along the original route or along the bypass route in response to corresponding boundary scan input signals.

7. The SoC of claim 5, wherein the circuitry and logic includes a plurality of switches configured to selectively switch routing of the boundary scan chain along the original route or along the bypass route in response to corresponding route selection signals.

8. The SoC of claim 5, wherein the circuitry and logic includes a power control unit configured to generate signals to selectively route the boundary scan chain along the original route or along the bypass route.

9. The SoC of claim 5, wherein the first I/O interface/port of the second portion is selectively powered by controllable power circuitry, and the circuitry and logic is configured such that when the controllable power circuitry is configured to supply power to the I/O interface/port of the second portion the boundary scan chain is routed along the original route, and when the controllable power circuitry is configured to not supply power to the first I/O interface/port of the second portion the boundary scan chain is routed along the bypass route.

10. The SoC of claim 1, wherein the circuitry and logic configured to facilitate boundary scan testing comprises:
controllable power circuitry that is selectively configurable to supply or not supply power to at least one I/O interface/port of the second portion that is not powered on by default; and
logic configured to receive boundary scan test input and, in response thereto, selectively control the controllable power circuitry to cause power to be supplied to the at least one I/O interface/port of the second portion.

11. The SoC of claim 10, wherein the I/O interface/port is used to facilitate an on-demand I/O function, and the SoC includes a power control unit configured to control the controllable power circuitry to provide power to an I/O interface/port of the second portion that is not powered by default in response to an associated on-demand I/O function event after the SoC has been initialized and is operating in a run-time operational mode.

12. The SoC of claim 1, wherein the boundary scan chain includes a switchable bypass route that is switchable to bypass a portion of the boundary scan chain passing through an I/O interface/port of the second portion that is not powered on by default, and the SoC further comprises:
means for selectively providing power to the I/O interface/port,
means for selectively routing the boundary scan chain through the I/O interface/port or to bypass the I/O interface/port.

13. The SoC of claim 12, wherein an original portion of the boundary scan chain passing through the interface/port of the second portion includes a first plurality of boundary scan cells comprising original cells, and a bypass boundary scan chain portion comprises a second plurality of boundary scan cells including a shadow cell for each original cell in the first plurality of boundary scan cells.

14. The SoC of claim 1, wherein the SoC includes an on-demand I/O with an associated I/O interface/port of the second portion, wherein neither of the on-demand I/O or its associated I/O interface port is powered on by default and wherein the on-demand I/O and its associated I/O interface/port are configured to be powered on in response to an associated on-demand event.

15. The SoC of claim 1, wherein one of the I/O interface/ports that is not powered on by default comprises an HDMI (High-Definition Multimedia Interface) interface/port.

16. The SoC of claim 1, wherein one of the plurality of I/O interface/ports that is not powered on by default comprises a USB3 (Universal Serial Bus third generation) interface/port.

17. A method for facilitating boundary scan testing of a system including a System on a Chip (SoC) having a plurality of Input/Output (I/O) interface/ports, each I/O interface/port operatively coupled to a respective set of I/O pins when powered, wherein at least one of the plurality of I/O interface/ports is not powered on by default, the SoC including a boundary scan chain comprising a plurality of boundary scan cells, wherein at least one portion of the boundary scan chain passes through a first I/O interface/port from amongst the at least one of the plurality of I/O interface/ports that is not powered on by default, the method comprising:
implementing at least one boundary scan chain portion comprising a switchable bypass route that is switchable to bypass a portion of the boundary scan chain passing through the first I/O interface/port; and
during boundary scan testing of the system, configuring a rerouted boundary scan chain on the SoC to include a portion of a boundary scan chain that is routed along the bypass route to bypass the first I/O interface/port.

18. The method of claim 17, wherein an original portion of the boundary scan chain passing through the first I/O interface/port includes a first plurality of boundary scan cells comprising original cells, and the switchable bypass route includes a bypass boundary scan chain portion comprises a second plurality of boundary scan cells including a shadow cell for each original cell in the first plurality of boundary scan cells.

19. The method of claim 18, further comprising operatively coupling each shadow cell in the second plurality of boundary scan cells to a respective I/O pin associated with the first I/O interface/port.

20. The method of claim 17, further comprising implementing logic in the SoC to enable rerouting of a boundary scan chain along a bypass route in response to test control signals received by the SoC during boundary scan testing.

21. The method of claim 17, wherein the boundary scan testing is performed in accordance with the IEEE Std.-1149.1 standard.

22. The method of claim 17, wherein the at least one of the plurality of I/O interface/ports that is not powered on by default comprises an on-demand I/O that is configured to be powered up in response to an associated on-demand event.

23. The method of claim 17, wherein the at least one of the plurality of I/O interface/ports that is not powered on by default includes an HDMI (High-Definition Multimedia Interface) interface/port.

24. The method of claim 17, wherein the at least one of the plurality of I/O interface/ports that is not powered on by default includes a USB3 (Universal Serial Bus third generation) interface/port.

25. A system, comprising:
a main board having a plurality of integrated circuits (ICs) and a System on a Chip (SoC) installed thereon and interconnect wiring connecting selected Input/Output (I/O) pins of the ICs to selected I/O pins on the SoC;
the SoC, including,
a plurality of I/O pins including the selected I/O pins on the SoC;
a plurality of I/O interface/ports, each I/O interface/port operatively coupled to a respective set of I/O pins from among the plurality of I/O pins when powered, wherein at least one of the plurality of I/O interface/ports is not powered on by default;
a boundary scan chain, comprising a plurality of boundary scan cells, wherein at least one portion of the boundary scan chain passes through a first I/O interface/port from amongst the at least one of the plurality of I/O interface/ports that is not powered on by default; and
circuitry and logic configured to facilitate boundary scan testing of the system, wherein the boundary scan testing includes testing of the interconnect wiring coupling the selected I/O pins of the ICs to the selected I/O pins on the SoC, and wherein the boundary scan testing is performed when the at least one of the plurality of I/O interface/ports that is not powered on by default is not powered.

26. The system of claim 25, wherein the SoC circuitry and logic configured to facilitate boundary scan testing comprises at least one boundary scan chain portion comprising a switchable bypass route that is switchable to bypass a portion of the boundary scan chain passing through the first I/O interface/port.

27. The system of claim 26, wherein an original portion of the boundary scan chain passing through the first I/O interface/port includes a first plurality of boundary scan cells comprising original cells, and a bypass boundary scan chain portion comprises a second plurality of boundary scan cells including a shadow cell for each original cell in the first plurality of boundary scan cells.

28. The system of claim 26, wherein the circuitry and logic is further configured to selectively route the boundary scan chain along an original route through the first I/O interface/port or along a bypass route that bypasses the first I/O interface/port.

29. The system of claim 25, wherein the circuitry and logic configured to facilitate boundary scan testing comprises:
   controllable power circuitry that is selectively configurable to supply or not supply power to the first I/O interface/port; and
   logic configured to receive boundary scan test input and, in response thereto, selectively control the controllable power circuitry to cause power to be supplied to the first I/O interface/port.

30. The system of claim 29, wherein the first I/O interface/port is used to facilitate an on-demand I/O function, and the SoC includes a power control unit configured to control the controllable power circuitry to provide power to the first I/O interface/port in response to an associated on-demand I/O function event after the SoC has been initialized and is operating in a run-time operational mode.

* * * * *